(12) United States Patent
Barth, Jr. et al.

(10) Patent No.: US 8,080,851 B2
(45) Date of Patent: Dec. 20, 2011

(54) DEEP TRENCH ELECTROSTATIC DISCHARGE (ESD) PROTECT DIODE FOR SILICON-ON-INSULATOR (SOI) DEVICES

(75) Inventors: John E. Barth, Jr., Williston, VT (US); Kerry Bernstein, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 603 days.

(21) Appl. No.: 12/201,462

(22) Filed: Aug. 29, 2008

(65) Prior Publication Data

US 2010/0052100 A1    Mar. 4, 2010

(51) Int. Cl.
*H01L 23/62* (2006.01)
(52) U.S. Cl. .............. 257/355; 257/356; 257/E21.703; 257/E21.396
(58) Field of Classification Search .............. 257/355, 257/356, E21.396, E21.703
See application file for complete search history.

(56) References Cited

U.S. PATENT DOCUMENTS

| | | | |
|---|---|---|---|
| 6,074,899 A * | 6/2000 | Voldman | 438/155 |
| 6,121,659 A * | 9/2000 | Christensen et al. | 257/347 |
| 6,352,882 B1 | 3/2002 | Assaderaghi et al. | |
| 6,566,713 B2 * | 5/2003 | Nii | 257/347 |
| 6,617,650 B1 | 9/2003 | Chen et al. | |
| 6,989,572 B2 * | 1/2006 | Stefanov et al. | 257/355 |
| 7,009,249 B2 * | 3/2006 | Nii | 257/347 |
| 7,227,226 B2 * | 6/2007 | Kawamura | 257/332 |
| 7,235,846 B2 | 6/2007 | Fung | |
| 7,372,109 B2 | 5/2008 | Chen et al. | |
| 7,384,854 B2 | 6/2008 | Voldman | |
| 2003/0207504 A1 * | 11/2003 | Fuselier et al. | 438/151 |
| 2005/0287718 A1 * | 12/2005 | Berndlmaier et al. | 438/149 |
| 2006/0071276 A1 | 4/2006 | Zundel et al. | |
| 2006/0252226 A1 * | 11/2006 | Berndlmaier et al. | 438/400 |
| 2008/0035924 A1 | 2/2008 | Runde et al. | |
| 2008/0135872 A1 | 6/2008 | Chen et al. | |

OTHER PUBLICATIONS

Shiao-Shien Chen, et al., "Characteristics of Low-Leakage Deep-Trench Diode for ESD Protection Design in 0.18-um SiGe BiCMOS Process", IEEE Transactions on Electron Devices, vol. 50, No. 7, Jul. 2003, pp. 1683-1689.

* cited by examiner

*Primary Examiner* — Thao Le
*Assistant Examiner* — Eric Jones
(74) *Attorney, Agent, or Firm* — Cantor Colburn LLP; Vazken Alexanian

(57) ABSTRACT

A semiconductor structure is disclosed. The semiconductor structure includes a bulk substrate of a first polarity type, a buried insulator layer disposed on the bulk substrate, an active semiconductor layer disposed on top of the buried insulator layer including a shallow trench isolation region and a diffusion region of the first polarity type, a band region of a second polarity type disposed directly beneath the buried insulator layer and forming a conductive path, a well region of the second polarity type disposed in the bulk substrate and in contact with the band region, a deep trench filled with a conductive material of the first polarity type disposed within the well region, and an electrostatic discharge (ESD) protect diode defined by a junction between a lower portion of the deep trench and the well region.

16 Claims, 3 Drawing Sheets

DEEP TRENCH ELECTROSTATIC DISCHARGE (ESD) PROTECT DIODE FOR SILICON-ON-INSULATOR (SOI) DEVICES

BACKGROUND

The present invention relates to silicon-on-insulator (SOI) devices, and more specifically, to an electrostatic discharge (ESD) diode for SOI devices.

Conventionally, semiconductor devices have become more compact and circuit layouts have become more complex. As a result, semiconductor devices in circuits are more susceptible to burn-out by ESD events. Various approaches for minimizing ESD burn-out have been presented. The known approaches are based on reverse-biased diodes formed in the substrate of the semiconductor material. In SOI wafers, however, the devices are electrically insulated from the substrate by a layer of silicon dioxide. In thin film SOI wafers, the silicon film is too thin to form large area vertical diodes.

SUMMARY

According to one embodiment of the present invention, a semiconductor structure is disclosed. The semiconductor structure includes a bulk substrate of a first polarity type, a buried insulator layer disposed on the bulk substrate, an active semiconductor layer disposed on top of the buried insulator layer including a shallow trench isolation region and a diffusion region of the first polarity type, a band region of a second polarity type disposed directly beneath the buried insulator layer and forming a conductive path, a well region of the second polarity type disposed in the bulk substrate and in contact with the band region, a deep trench filled with a conductive material of the first polarity type disposed within the well region, and an electrostatic discharge (ESD) protect diode defined by a junction between a lower portion of the deep trench and the well region.

In another embodiment, a method of forming semiconductor structure including an electrostatic discharge (ESD) protect diode is disclosed. The method includes forming an buried insulator layer on a bulk substrate of a first polarity type, forming an active semiconductor layer having a shallow trench isolation region and a diffusion region of the first polarity type on top of the buried insulator layer, forming a band region of a second polarity type within the bulk substrate and directly beneath the buried insulator layer to form a conductive path, forming a well region of the second polarity type in the bulk substrate and in contact with the band region, etching a deep trench through the active semiconductor layer, the buried insulator layer and the well region, blocking oxide formation within the deep trench, filling the deep trench with a conductive material of the first polarity type, and defining the ESD protect diode at a junction between a lower portion of the deep trench and the well region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
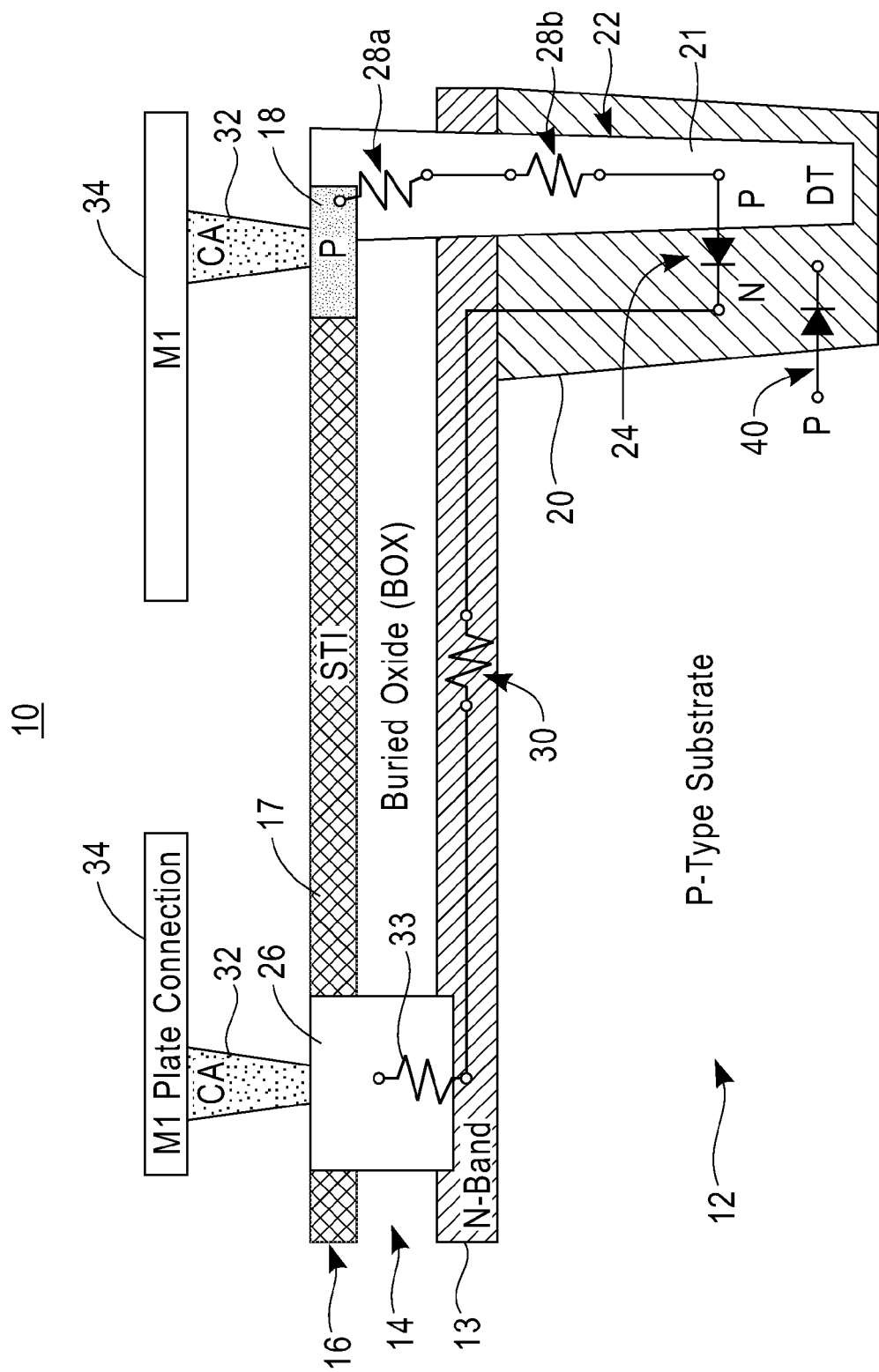
FIG. 1 is a lateral view illustrating a semiconductor structure having an ESD protect diode that can be implemented within embodiments of the present invention.

With reference now to FIG. 1, the present invention incorporates eDRAM technology into high performance semiconductor structures. As shown in FIG. 1, according to an embodiment, a multi-layer semiconductor structure 10 e.g., a silicon-on-insulator (SOI) structure incorporates an ESD protect diode 24 for protecting the semiconductor structure 10 during an ESD event to prevent damage to the semiconductor structure 10. An ESD event occurs when a high potential voltage and current are rapidly discharged into the device or circuit. The present invention may be applied to a NMOS or PMOS device.

As shown in FIG. 1, the semiconductor structure 10 includes bulk substrate 12 such as a P-type substrate which acts as a handle wafer. A buried insulator layer 14 (e.g., a thick buried oxide (BOX) layer) is formed on top of the P-type substrate 12. An active semiconductor layer 16 including n-type or p-type dopants is then formed on top of the insulator layer 14. As shown in FIG. 1, a shallow trench isolation (STI) region 17 and a P-diffusion 18 are formed in the active semiconductor layer 16. A band region 13 (e.g., a N-band region) is formed in the P-type substrate 12 directly beneath the buried insulator layer 14 via high-energy implantation of an n-type dopant. The band region 13 forms a conductive path. A well region (e.g., a N-well region) 20 is formed in the P-type substrate 12 and a deep trench 22 is formed via etching and drilling through the active semiconductor layer 16 and the buried insulator layer 14, and the well region 20. According to one embodiment of the present invention, the deep trench 22 is uninsulated. Before filling the deep trench 22 with a conductive material 21, a hard mask layer (not shown) is deposited and areas that require oxidation are selectively etched away while blocking oxidation formation within the deep trench 22. A detailed description of the blocking operation will be described later with reference to FIG. 3. Then, the conductive material 21 is deposited into the deep trench 22 via a deposition process. The conductive material 21 may be polysilicon or any suitable conductive material for the purposes disclosed herein may be used. In one embodiment, the conductive material 21 is doped polysilicon deposited, for example, via a low temperature epitaxial process. In one embodiment, the deep trench 20 is filled with P+ polysilicon. The conductive material 21 is then recessed in the trench such that a top surface of the trench borders the active semiconductor layer 16. The active semiconductor layer 16 is then replanarized. According to an embodiment of the present invention, the well region 20 provides a junction needed for ESD protection. The ESD diode 24 is defined by a junction between a lower portion of the deep trench 22 and the well region 20 such that the ESD protect diode 24 is formed in the lower portion of the deep trench 22 (i.e., between the conductive material 21) and the well region 20. A body (BI) contact 26 formed between a top surface of the active semiconductor layer 16 and extends into the band region 13.

According to an embodiment of the present invention, an anode of the ESD protect diode is defined within the deep trench 22 and a cathode of the ESD protect diode is defined within the well region 20.

A plurality of resistors 28, 30 and 33 are also defined in the semiconductor structure 10. According to one embodiment of the present invention, a first resistor 28a is defined by a junction between the diffusion region 18 and the deep trench 22, and a second resistor 28b is defined by a length of the deep trench 22. A third resistor 30 is defined by a longitudinal length of the band region 13 and a fourth resistor 33 is defined in the BI contact 26. The third resistor 30 is electrically connected to the cathode of the ESD protect diode 24 and the fourth resistor 33 within the BI contact 26.

As mentioned above, the band region 13 forms a conductive path for discharging electrical energy resulting from the occurrence of events. According to an embodiment of the present invention, the conductive path extends from the deep trench 22 to the BI contact 26.

According to an embodiment of the present invention, the BI contact 26 is connected to ground and supply, thereby providing a discharge path for ESD events. A plurality of contacts 32 are formed respectively above the BI contact 26 and the diffusion region 18, to provide electrical connection between metal plates 34 connected with wiring structures and the semiconductor structure 10 via contacts 32.

Further shown in FIG. 1, according to one embodiment of the present invention, a parasitic diode 40 is formed at a junction between the well region 22 and the P-type substrate 12, providing additional decoupling capacitance.

Figure 2:
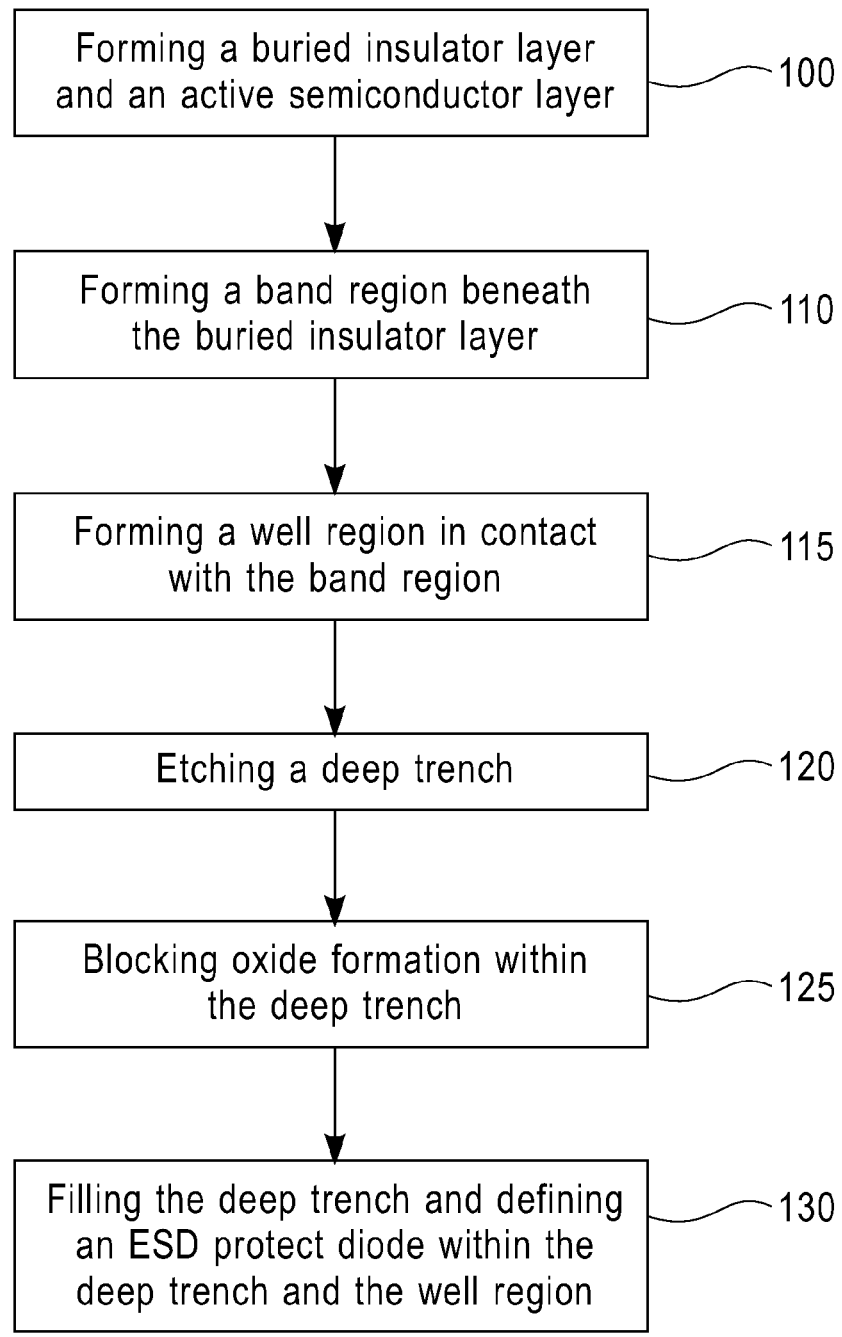
FIG. 2 is a flow chart illustrating a method for forming the semiconductor structure as shown in FIG. 1 that can be implemented within embodiments of the present invention.

FIG. 2 is a flow chart that illustrates a method of forming a semiconductor structure including an ESD protect diode that can be implemented within embodiments of the present invention. As shown in FIG. 2, the process for forming the semiconductor structure is as follows: at operation 100, a buried insulator layer is formed on a bulk substrate of a first polarity type and an active semiconductor layer having a STI region and a diffusion region of the first polarity type is formed on top of the buried insulator layer. From operation 100, the process moves to operation 110 where a band region of a second polarity type is formed within the bulk substrate and directly beneath the buried insulator layer, thereby forming a conductive path to discharge electrical energy due to the occurrence of ESD events. From operation 110, the process moves to operation 115, where a well region of the second polarity is formed in the bulk substrate and in contact with the band region. From operation 115, the process moves to operation 120 where a deep trench is etched through active semiconductor layer, the buried oxide layer, and the well region. From operation 120, the process moves to operation 125 where oxide formation is blocked within the deep trench (a detailed description of operation 125 will be described below with reference to FIG. 3). From operation 125, the process moves to operation 130 where the deep trench is filled with a conductive material of a first polarity type and an ESD protect diode is defined by a junction between a lower portion of the deep trench and the well region.

Figure 3:
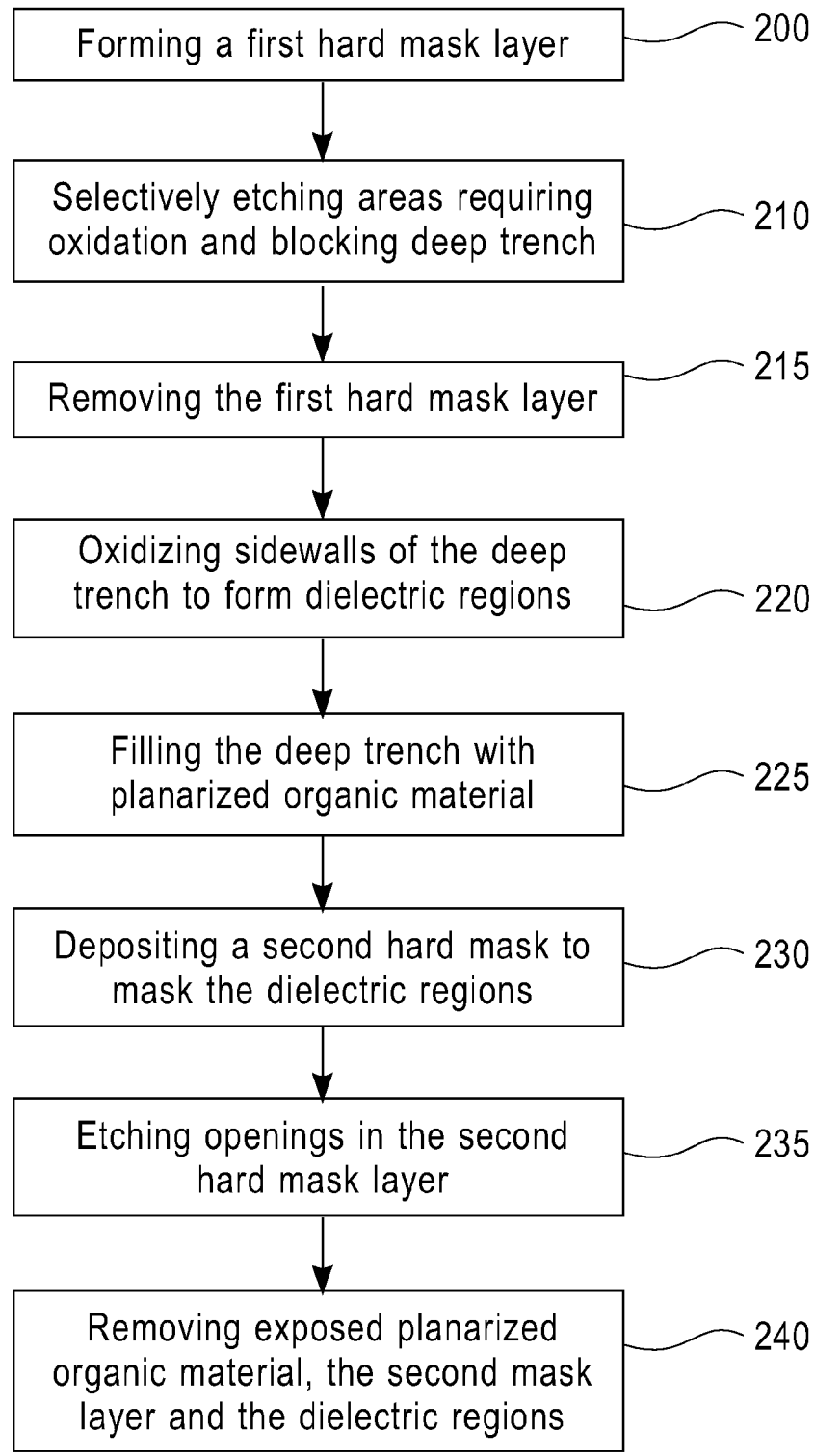
FIG. 3 is a flowchart illustrating an operation for blocking oxide formation of the method as shown in FIG. 2 that can be implemented within embodiments of the present invention.

FIG. 3 is a flowchart illustrated a detailed description of operation 125 of the method as shown in FIG. 2. Specifically, as shown in FIG. 3, an oxide formation blocking operation according to one embodiment of the present invention is as follows: in operation 200 a first hard mask layer is formed. From operation 200, the process moves to operation 210 where areas requiring oxidation are selectively etched via an 02 plasma process for example while blocking the deep trench. From operation 210, the process moves to operation 215 where the first hard mask layer is removed. After the first hard mask layer is removed, the wafer (not shown) may be ashed to remove organic material from the deep trench. From operation 215, the process moves to operation 220 where the sidewalls of the deep trench are oxidized to form dielectric regions of a desired thickness, for example, for a thin dielectric via. From operation 220, the process moves to operation 225 where the deep trench is filled with a planarized organic material. From operation 225, the process moves to operation 230 where a second hard mask layer is deposited to mask the dielectric regions. Next, in operation 235, openings in the second hard mask layer are etched. From operation 235, the process moves to operation 240 where exposed planarized organic material in the deep trench is removed via an O2 plasma process, the second hard mask layer is removed and the dielectric regions are removed from the sidewalls of the deep trench. Optionally, the wafer may be ashed to remove the organic material and the nitride from the wafer surface may be removed if necessary. Then, the process returns to operation 130 (as depicted in FIG. 2) where the deep trench is filled with the conductive material and the ESD protect diode is defined.

Since the present invention discloses an ESD protect diode defined within the deep trench and the well region, the present invention provides ESD protection for SOI devices preventing high magnitude voltages such as those generated by ESD from damaging the semiconductor structure without compromising the benefits of the SOI configuration. In addition, the parasitic diode is useful in adding decoupling capacitance to the semiconductor structure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor structure comprising:
a bulk substrate of a first polarity type;
a buried insulator layer disposed on the bulk substrate;
an active semiconductor layer disposed on top of the buried insulator layer including a shallow trench isolation region and a diffusion region of the first polarity;
a band region of a second polarity type disposed directly beneath the buried insulator layer and forming a conductive path;
a well region of the second polarity type disposed in the bulk substrate and in contact with the band region;
a deep trench filled with a conductive material of the first polarity type disposed within the well region, the deep trench beginning at a top surface of the active semiconductor layer, extending completely through the buried insulator layer and the band region, and into the well region; and
an electrostatic discharge (ESD) protect diode defined by a junction between a lower portion of the deep trench and the well region.

2. The semiconductor structure of claim 1, wherein the deep trench is uninsulated.

3. The semiconductor structure of claim 2, further comprising a body (BI) contact extending into the band region, the BI contact beginning at the top surface of the active semiconductor layer, and extending completely through the buried insulator layer.

4. The semiconductor structure of claim 3, wherein an anode of the ESD protect diode is defined within the deep trench and a cathode of the ESD protect diode is defined within the well region.

5. The semiconductor structure of claim 4, further comprising:
a first resistor defined by a junction between the diffusion region and the deep trench; and
a second resistor defined by a length of the deep trench.

6. The semiconductor structure of claim 5, further comprising:
a third resistor defined by a longitudinal length of the band region; and
a fourth resistor defined in the BI contact, wherein the third resistor is electrically connected to the cathode of the ESD protect diode and the fourth resistor.

7. The semiconductor structure of claim 6, wherein the conductive path extends from the deep trench to the BI contact within the band region to discharge electrical energy due to an occurrence of ESD events.

8. The semiconductor structure of claim 7, further comprising a parasitic diode defined by a junction between the well region and the bulk substrate.

9. A semiconductor structure comprising:
a P-type substrate;
a buried oxide layer disposed on the P-type substrate;
an active semiconductor layer disposed on top of the buried insulator layer including a shallow trench isolation region and a P-diffusion region;
a N-band region disposed directly beneath the buried oxide layer and forming a conductive path;
a N-well region disposed in the bulk substrate and in contact with the N-band region;
a deep trench filled P+ polysilicon disposed within the N-well region, the deep trench beginning at a top surface of the active semiconductor layer, extending completely through the buried oxide layer and the N-band region, and into the N-well region; and
an electrostatic discharge (ESD) protect diode defined by a junction between a lower portion of the deep trench and the N-well region.

10. The semiconductor structure of claim 9, wherein the deep trench is uninsulated.

11. The semiconductor structure of claim 10, further comprising a N-band contact extending into the N-band region, the N-band contact beginning at the top surface of the active semiconductor layer, and extending completely through the buried oxide layer.

12. The semiconductor structure of claim 11, wherein an anode of the ESD protect diode is defined with the deep trench and a cathode of the ESD protect diode is defined within the N-well region.

13. The semiconductor structure of claim 12, further comprising:
a first resistor defined by a junction between the P-diffusion region and the deep trench; and
a second resistor defined by a length of the deep trench.

14. The semiconductor structure of claim 13, further comprising:
a third resistor defined by a longitudinal length of the N-band region; and
a fourth resistor defined in the N-band contact, wherein the third resistor is electrically connected to the cathode of the ESD protect diode and the fourth resistor.

15. The semiconductor structure of claim 14, wherein the conductive path extends from the deep trench to the N-band contact within the N-band region to discharge electrical energy due to an occurrence of ESD events.

16. The semiconductor structure of claim 15, further comprising a parasitic diode defined by a junction between the N-well region and the P-type substrate.

* * * * *